United States Patent [19]

Rauchmaul et al.

[11] Patent Number: 5,106,785
[45] Date of Patent: Apr. 21, 1992

[54] METHOD FOR ENCAPSULATING ELECTRONIC COMPONENTS OR ASSEMBLIES USING A THERMOPLASTIC ENCAPSULANT

[75] Inventors: Siegfried Rauchmaul, Munich; Hans-Fr. Schmidt, Eurasburg; Juergen Bednarz, Penzberg; Karl-Heinz Horsmann, Munich; Ralf Criens, Munich; Horst Scheffler, Munich; Hanns-Heinz Peltz, Munich, all of Fed. Rep. of Germany

[73] Assignee: Siemens Aktiengesellschaft, Munich, Fed. Rep. of Germany

[21] Appl. No.: 464,934

[22] Filed: Jan. 16, 1990

[30] Foreign Application Priority Data

Jan. 16, 1989 [DE] Fed. Rep. of Germany ....... 3901112
May 19, 1989 [EP] European Pat. Off. ......... 89109084.7

[51] Int. Cl.5 .............. H01L 21/52; H01L 21/56; H01L 21/58; H01L 21/60
[52] U.S. Cl. ..................... 437/214; 437/215; 437/217; 437/219; 437/220
[58] Field of Search .......... 437/215, 217, 219, 220, 437/214; 357/80, 74

[56] References Cited

U.S. PATENT DOCUMENTS 3,706,840 12/1972 Moyle et al. ............... 437/217
4,701,999 10/1987 Palmer ....................... 357/70

FOREIGN PATENT DOCUMENTS

| 55-30809 | 3/1980 | Japan | 437/219 |
| 56-83048 | 7/1981 | Japan | 437/215 |
| 60-136347 | 7/1985 | Japan | 437/214 |
| 60-189940 | 9/1985 | Japan | 437/214 |
| 62-21250 | 1/1987 | Japan | 437/219 |
| 63-184357 | 7/1988 | Japan | 437/214 |
| 63-287041 | 11/1988 | Japan | 437/215 |
| 111352 | 1/1989 | Japan | 357/74 |

Primary Examiner—Olik Chaudhuri
Assistant Examiner—David E. Graybill
Attorney, Agent, or Firm—Hill, Van Santen, Steadman & Simpson

[57] ABSTRACT

A component or assembly is accommodated in a housing formed of at least two joined housing parts. Terminal legs are conducted toward the outside of the housing. In order to enhance a sealing effect, and thus for protection against internal corrosion, an outside encapsulation of a thermoplastic plastic is applied to the housing by injection molding at least in the region of the joints of the housing and in the exit region of the terminal legs. Particularly given the hermetically tight encapsulation of surface-wave filters, encircling sections having a low wall thickness are provided on the housing parts in their peripheral regions, these sections being fused to the outside encapsulation.

11 Claims, 5 Drawing Sheets

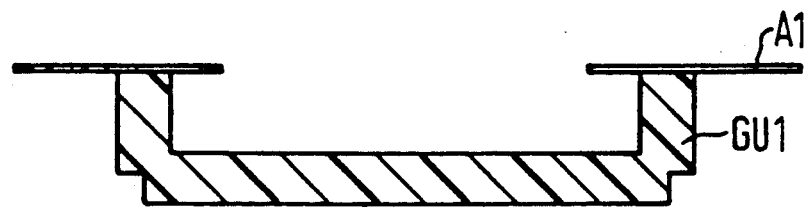
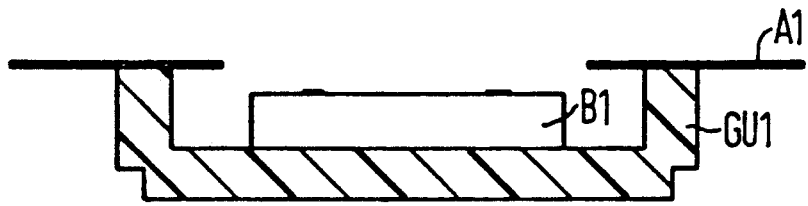
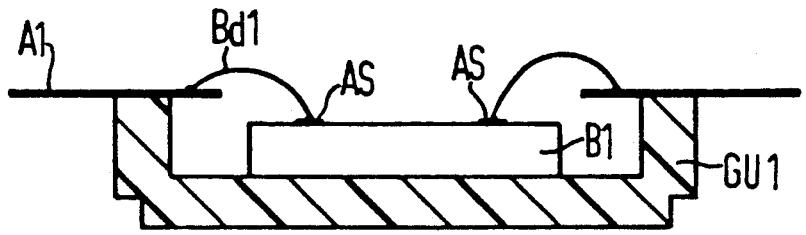
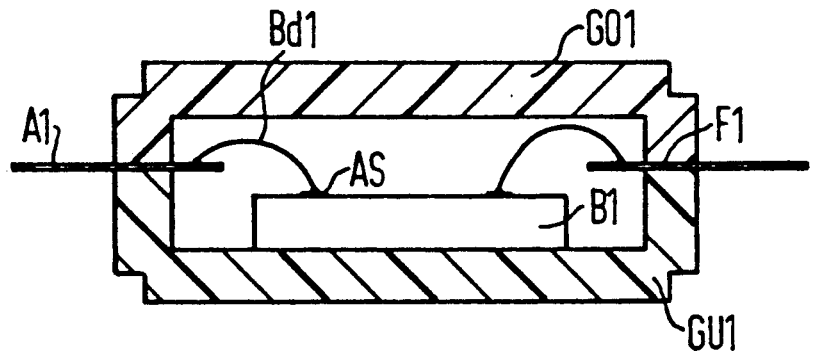
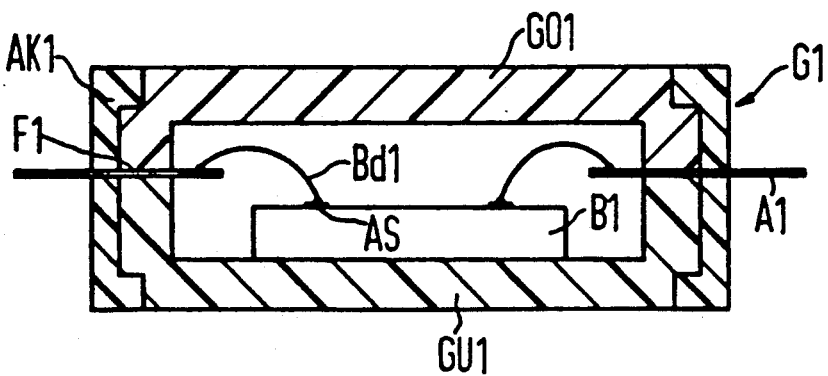

METHOD FOR ENCAPSULATING ELECTRONIC COMPONENTS OR ASSEMBLIES USING A THERMOPLASTIC ENCAPSULANT

BACKGROUND OF THE INVENTION

The invention is directed to a method and an encapsulation for encapsulating electrical or electronic components or assemblies with a housing formed by at least two joined housing parts and having terminal legs guided to the outside.

It is known that electronic components such as integrated circuits or assemblies including hybrid circuits, and which are enveloped with thermoset plastics, can be destroyed by internal stresses or corrosion. The internal stresses are produced by plastics shrinkage as well as by different thermal expansions of the component or the assembly, system carrier, and/or the plastics. An envelope is therefore required which compensates both the stresses and the different expansions, and also offers protection against internal corrosion. Dependent on the structure, integrated circuits, for example, are presently covered in a cost intensive way with a protective layer before application of the envelope of thermoset plastic. This protective layer is formed, for example, of a plasma nitride, polyimide, and/or gel drops. The regions outside of the chip such as for example the chip circumference and the contact location between the bond wire and the allocated terminal leg, thus remain unprotected. When enveloping assemblies, an elastic intermediate layer for protecting the components and the circuit is employed and is formed, for example, of silicone gel or of an elastic acrylate.

Methods and encapsulations for encapsulating electrical or electronic components or assemblies are also already known wherein the components or assemblies are accommodated in a closed housing from which only the terminal legs are conducted out. These housings formed of at least two joined housing parts offer a mechanical protection of the components or assemblies and, in particular, of the sensitive connections to the terminal legs as well. On the other hand, however, moisture can penetrate into the housing due to the joining together of the housing parts and can penetrate in the passage region of the terminal legs, i.e. the protection against internal corrosion is inadequate.

SUMMARY OF THE INVENTION

An object of the invention is to create an economical and easily automated method and an encapsulation for encapsulating electrical or electronic components or assemblies that enables both a compensation of tensions and different expansions, as well as a reliable protection against internal corrosion.

According to the invention, an outside encapsulation formed of a plastic, particularly of a thermoplastic plastic, is applied to the housing by injection molding at least in the region of the housing joints and in the exit region of the terminal legs.

The invention is based on the perception that the advantages of an accommodation of components or assemblies in housings can only be fully exploited when a tight encapsulation in the region of the housing joints and in the exit region of the terminal legs simultaneously prevents a penetration of moisture, and thus offers a reliable protection against internal corrosion. The application of this encapsulation by injection molding guarantees that the terminal legs emerging from the housing are completely extrusion-coated in the especially critical exit region and also guarantees that the joints are completely sealed. By employing a thermoplastic plastic for the outside encapsulation, extremely short clock times can be achieved in the injection molding, i.e. the method of the invention permits an economical encapsulation particularly suitable for mass production of electrical or electronic components or assemblies.

According to a preferred development of the invention, the housing is formed of a lower housing part and a joined upper housing part. The lower housing part is manufactured of a thermoplastic plastic by injection molding. The terminal legs are at least partially extrusion-coated in the passage region during the injection molding of the lower housing part. The advantages of injection molding can then also be transferred here to the manufacturer of the lower housing part, wherein the exit region of the terminal legs from the housing is also sealed better, and thus a further enhancement of the overall sealing effect results. Moreover, the component or the assembly can be anchored at the floor of the lower housing part after the injection molding of the lower housing part, so that the inner ends of the terminal legs can then be connected to the allocated terminals of the component or of the assembly in electrically conductive fashion. A negative influence on the sensitive, electrically conductive connections during further encapsulation can then be reliably suppressed given this procedure.

According to a modification of the method of the invention, the housing can also be joined of a lower housing part, of a middle housing part, and of an upper housing part. The middle housing part is manufactured of thermoplastic plastic by injection molding and the terminal legs are completely extrusion-coated in the passage region when the lower housing part is injection molded. Thus, the terminal legs can be completely extrusion-coated when injection molding the middle housing part, i.e. a sealing effect that also satisfies extreme requirements results in combination with the outside encapsulation applied thereafter. After the joining of the middle housing part and lower housing part, the inner ends of the terminal legs can then also be connected in electrically conductive fashion to the allocated terminals of the components anchored on the floor of the lower housing part or of the assemblies anchored on the floor of the lower housing part.

In a further modification of the method of the invention developed especially for the encapsulation of chips, a lower housing part of a thermoplastic plastic is first applied by injection molding to the underside of a system carrier encompassing island, island web, and terminal legs. A component is then secured to the island and the inner ends of the terminal legs are connected to the allocated terminals of the component in electrically conductive fashion. The outside encapsulation is applied at the junction of the lower housing part and an upper housing part. In this procedure adapted to mass production, a plurality of system carriers can then also be simultaneously processed, for example, in the form of a ten-fold panel. Before the application of the lower housing part to the system carrier, an adhesion promoter can then also be potentially applied to the system carrier in the passage region of the terminal legs for further enhancing the tightness. In view of an optimally high tightness, it has also proven expedient when the interspaces between the terminal legs are partially filled with thermoplastic plastic when applying the lower housing part to the system carrier.

When the island web is anchored in the thermoplastic plastic during application of the lower housing part to the system carrier, then an extremely reliable, mechanical fixing of the island results, as does an extremely reliable mechanical fixing of the component in the housing to be applied to the island later.

The invention also relates to an encapsulation of electrical or electronic components or assemblies in a housing joined of at least two housing parts from which terminal legs are guided toward the outside, whereby an outside encapsulation formed of a thermoplastic plastic is applied to the housing by injection molding at least in the region of the joints of the housing and in the exit region of the terminal legs. In view of the mechanical protection of components or assemblies and in view of the protection against internal corrosion, this encapsulation then also offers the advantages already set forth in the context of the method of the invention. A further enhancement of the sealing effect can then also be achieved since the outside encapsulation and the other housing parts engage in one another with projection and recess. Further, it is especially economical when the outside encapsulation and the other housing parts are manufactured of the same thermoplastic plastic by injection molding. In view of especially economical processing conditions, of a high mechanical stability of the overall encapsulation, and of a high chemical stability of the overall encapsulation, it has proven especially beneficial when the outside encapsulation and the other housing part are formed of polyphenylene sulfide.

A further improvement of the encapsulation in view of a hermetically tight connection is achieved in that all around sections having low wall thickness, especially closed web-shaped sections, are fashioned at the housing parts in their peripheral region, these sections being preferably embedded into the outside encapsulation and being bonded thereto. An encapsulation executed in this fashion is especially suitable for surface-wave filters.

For bonding the peripherally encircling sections to the outside encapsulation, the injection temperature of the outside encapsulation and melting temperature of the encircling sections is chosen such that the encircling sections are partially melted by the plastic compound and enter into the desired fused bond therewith when cooling.

A reliable sealing and insulation of the electrical or electronic components or assemblies in the interior of the encapsulation is guaranteed with this fused connection.

BRIEF DESCRIPTION OF THE DRAWINGS

FIGS. 1 through 5 show greatly simplified, schematic illustrations of the essential method steps in the encapsulation of an electronic component in a housing joined of two housing parts;

DESCRIPTION OF THE PREFERRED EMBODIMENTS

In the first exemplary embodiment illustrated with reference to FIGS. 1 through 5, a lower housing part GU1 of a thermoplastic plastic is manufactured by injection molding according to FIG. 1. In the injection molding, the terminal legs A1 interconnected in, for example, the form of a system carrier, are placed into the hollow mold of the injection molding tool such that three sides of the terminal legs A1 are extrusion-coated in the exit region, and the upper side of the terminal legs A1 and the upper side of the lower housing part GU1 lie in one plane.

After the manufacture of the lower housing GU1, a component B1 is anchored to the floor thereof according to FIG. 2, for example, by gluing. Thus, the inner ends of the terminal legs A1 are connected to the allocated terminals AS of the component B1 in electrically conductive fashion via fine bond wires BD1 according to FIG. 3.

FIG. 4 shows that, after the bonding set forth above, an upper housing part GO1 is put in place onto the lower housing GU1, whereby the joint between lower housing part GU1 and upper housing part GO1 is referenced F1. The upper housing part GO1 is likewise manufactured of a thermoplastic plastic by injection molding.

The structure joined according to FIG. 4 is subsequently introduced in the hollow mold of a further injection molding tool so that the outside encapsulation AK1 shown in FIG. 5 for overall completion of the housing referenced G1 can be applied by injection molding with a thermoplastic plastic. The outside encapsulation AK1 that is interlocked with the lower housing GU1 and an upper housing part GO1 via projections and recesses (not referenced in detail) forms an annular, self-contained clamp that guarantees a firm, mechanical cohesion of the housing parts and seals in excellent fashion the joint F1 as well as the exit region of the terminal legs A1. The lower housing part GU1, the upper housing part GO1 and the outside encapsulation AK1 are manufactured of the same thermoplastic plastic by injection molding, whereby in particular, polyphynelene sulfide excels on the basis of its processing properties, on the basis of its mechanical properties, and on the basis of its chemical properties.

Figure 6:
FIGS. 6 through 12 show greatly simplified, schematic illustrations of the essential method steps in the encapsulation of an assembly in a housing joined of three housing parts.
Figure 7:
Figure 8:

In the second exemplary embodiment shown with reference to FIGS. 6 through 12, a lower housing part GU2 according to FIG. 6 and an upper housing part GO2 according to FIG. 7 are manufactured of a thermoplastic plastic by injection molding. According to FIG. 8, a middle housing part GM2 is likewise manufactured of a thermoplastic plastic by injection molding. Here, however, the terminal legs A2 interconnected in the form, for example, of a system carrier, are placed into the hollow mold of the injection molding tool such that all terminal legs A2 are completely extrusion-coated in the exit region.

Figure 9:
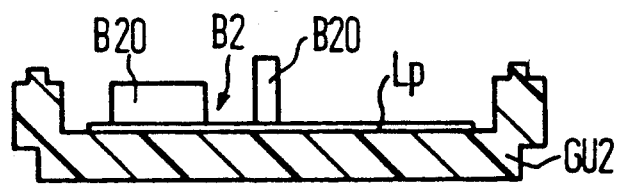

According to FIG. 9, an assembly referenced B2 overall is then anchored on the floor of the lower housing part GU2, a printed circuit board Lp, and components B20 thereof visible in the illustrated exemplary embodiment. The anchoring of the printed circuit board Lp occurs, for example, via nipples that are not visible in the drawing and that are applied to the floor of the lower housing part GU2 during the injection molding, and engage into corresponding holes of the printed circuit board.

Figure 10:
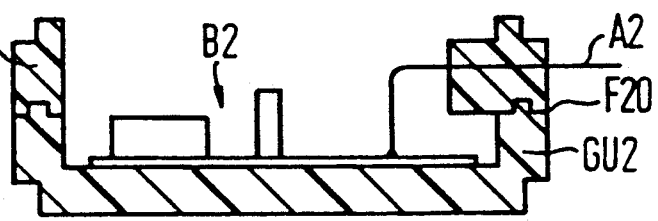
Figure 11:
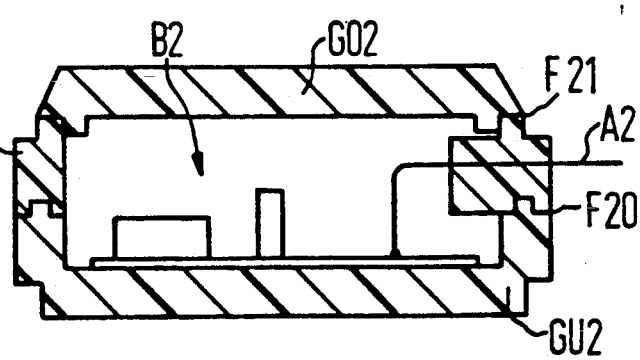

After the anchoring of the assembly B2 on the floor of the lower housing part GU2, the middle housing part GM2 according to FIG. 10 is placed onto the lower housing part GU2, whereupon the electrically conductive connections between the inner ends of the terminal legs A2 and the assembly are produced in a known fashion. It may also be seen in FIG. 10 that the lower housing part GU2 and the middle housing part GM2 engage into one another in the region of the joint F20 with projections and recesses that are not referenced in greater detail. The cover-shaped upper housing part GO2 subsequently put in place according to FIG. 11 is also held in the opening of the middle housing GM2 with a collar that is not referenced in greater detail. The joint between the middle housing part GM2 and the upper housing part GO2 is referenced F21.

Figure 12:
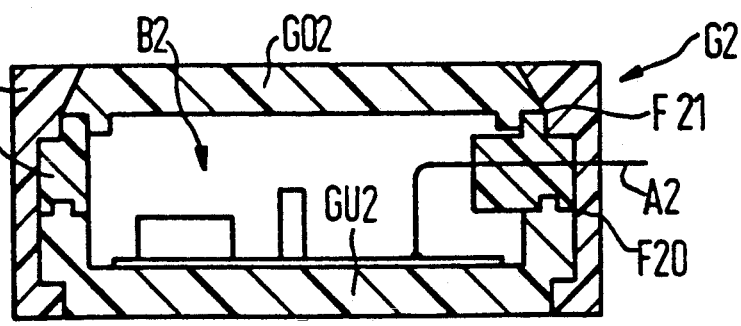

The structure joined together according to FIG. 11 is subsequently introduced into the hollow mold of a further injection molding tool, so that the outside encapsulation AK2 shown in FIG. 12 for completing the housing referenced G2 overall can be applied by injection molding thermoplastic plastic. The outside encapsulation AK2 forms an annular, self-contained chamber that guarantees a firm, mechanical cohesion of the housing parts and seals in excellent fashion the joints F20 and F21. The outside encapsulation AK2 also forms an additional, outside seal for the exit region of the terminal legs A2 from the middle housing part GM2. The lower housing part GU2, the middle housing part GM2, the upper housing part GO2, and the outside encapsulation AK2 are manufactured of the same thermoplastic plastic by injection molding, whereby polyphenylene sulfide is again particularly well-suited as the material here.

In the third exemplary embodiment illustrated with reference to FIGS. 13 through 20, a system carrier ST shown in FIG. 13 forms the basis. The terminal legs thereof are referenced A3 and the rectangular island extending at an island web IS is referenced I. Proceeding in an outward direction from the two island webs IS, holes L1 whose function shall be set forth in detail later are introduced into the regions of the system carrier ST located there. It may also be seen in FIG. 13 that an adhesion promoter HV is applied with, for example, tampon printing onto the underside of the system carrier ST shown here in the region of the inner ends of the terminal legs A3 and in the region of the island webs IS.

Figure 13:
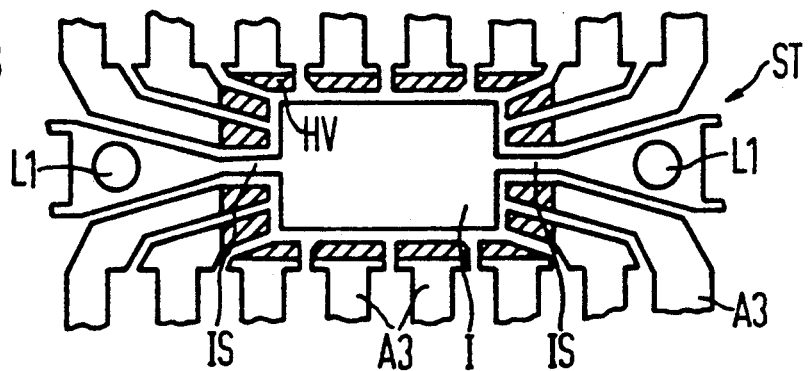
FIGS. 13 through 20 illustrate greatly simplified, schematic illustrations of the essential method steps in the encapsulation of an integrated circuit in a housing joined of two housing parts.
Figure 14:
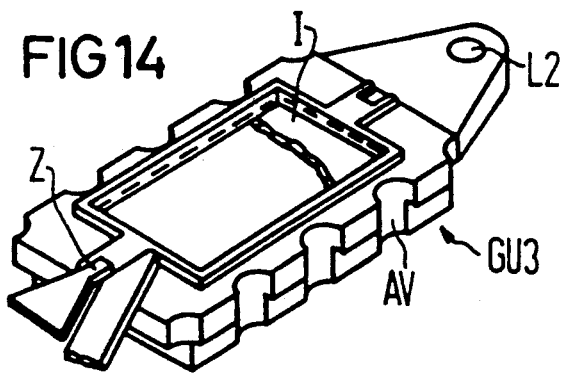

According to FIG. 14, a lower housing part GU3 is applied by injection molding a thermoplastic plastic to the underside of the system carrier ST shown in FIG. 13. The island I is thus completely supported by the thermoplastic plastic and is held secured against detaching with a clamp K of the thermoplastic plastic in the region of the island web IS. Terminal leg anchorings AV remain partially recessed when injection molding the lower housing part GU3, whereas the interspaces Z between the terminal legs A3, by contrast, are partially filled with the thermoplastic plastic. Furthermore, the lower housing part GU3 is provided with an injected hole L2 whose position coincides with the position of the allocated hole L1 in the system carrier ST.

Figure 15:
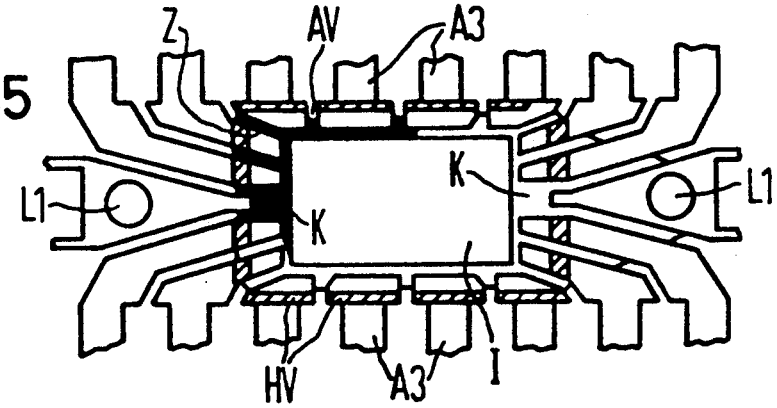

FIG. 15 shows a plan view onto the upper side of the system carrier ST after the application of the lower housing part GU3 to the underside of the system carrier ST. Here, too, the partially recessed terminal leg anchorings AV, the partially filled interspaces Z and the clamps K can again be seen, whereby interspaces Z and a clamp K are emphasized here as blackened regions over only parts thereof. FIG. 15 further shows that the upperside of the system carrier ST is coated with an adhesion promoter HV in the exit region of the terminal legs A3 to further enhance the tightness. A component (not shown in FIG. 15) is subsequently glued onto the island I and has its terminals connected to the allocated, inner ends of the termina legs A3 by bonding.

Figure 16:
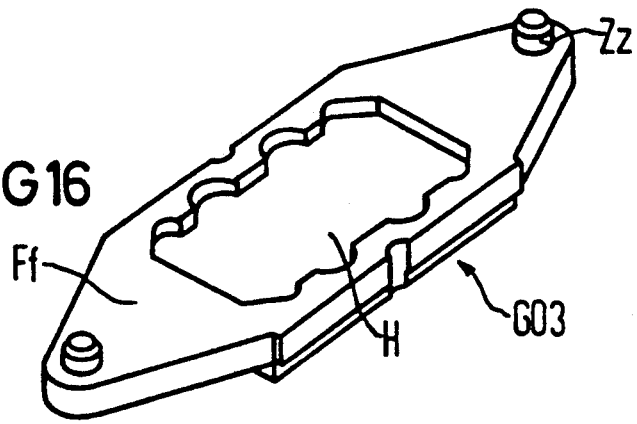

The upper housing part GO3 shown in FIG. 16 is likewise manufactured of a thermoplastic plastic by injection molding. This upper housing part GO3 is thereby formed in the injection molding tool (not shown) such that the joining face Ff and the cavity H lie at the top, and centering pegs Zz project upwardly out of the joining face Ff. The upper housing part GO3 applied to the system carrier ST can be turned around in this fashion, i.e. can be inserted into the opened injection molding tool of the upper housing part with the component down. The centering pegs Zz thus penetrate into the allocated holes L1 and L2.

Figure 17:
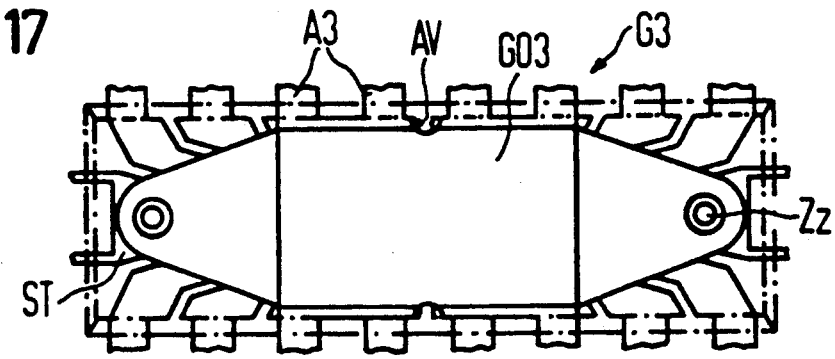

After the above-described joining of the lower housing part GU3 and the upper housing GO3, an outside encapsulation AK3 of a thermoplastic plastic is applied in a further injection molding tool to complete the housing, referenced G3 in FIG. 17. The outside contour of this outside encapsulation AK3 is indicated by dot-dashed lines in FIG. 17 that shows a plan view onto the upper side of the housing G3. It may be seen that the remainder of the system carrier ST that stands free toward the outside as well as the terminal leg anchorings AV and the interspaces Z are filled with thermoplastic plastic when the outside encapsulation AK3 is applied.

Figure 18:
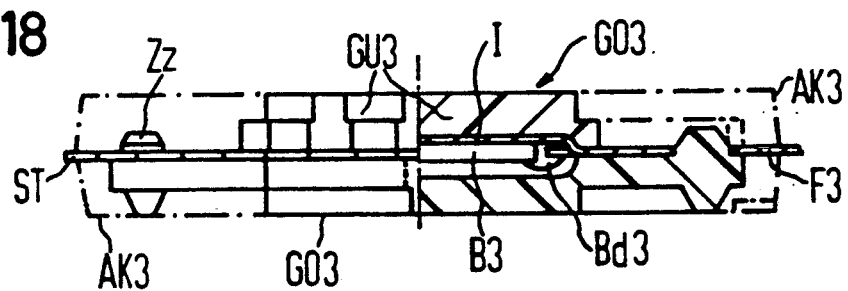
Figure 19:
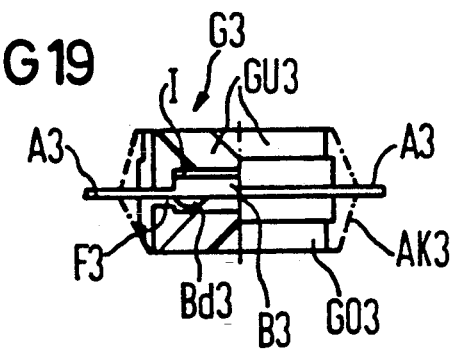

FIGS. 18 and 19 show two cut side views of the housing G3 in halves, whereby the contour of the outside encapsulation AK3 is again shown here with dot-dashed lines. It may be seen that the outside encapsulation AK3 embraces the housing G3 in the form of a self-contained clamp and reliably seals the joints F3 between the lower housing part GU3 and upper housing part GO3 as well as the exit region of the terminal legs A3. Further, it may be clearly seen that a component B3 in the housing G3 (this component B3 involving an integrated circuit) is secured on the island I such that it projects into the cavity H of the upper housing part GO3. The fine bond wires Bd3 between the component B3 and the inner ends of the terminal legs A3 also are protected in the cavity H.

Figure 20:
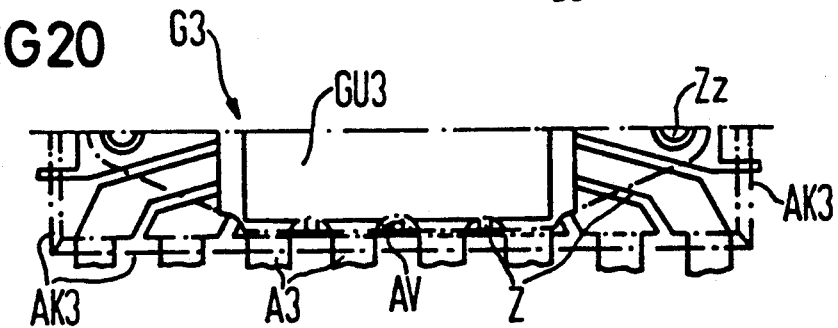

FIG. 20 finally shows a plan view onto the underside of the housing G3 covering only one-half thereof, whereby the contour of the outside encapsulation AK3 is again indicated here by dot-dashed lines. Here, too, it can again be seen that the terminal leg anchorings AV and the interspaces Z are completely filled out with thermoplastic plastic when the outside encapsulation AK3 is injection molded.

The lower housing part GU3, the upper housing part GO3 and the outside encapsulation AK3 are manufactured of the same thermoplastic plastic by injection molding, whereby polyphenylene sulfide has also proven itself here. Polyphenylene sulfide (for example, trademark "Tedur" of Bayer AG, Leverkusen, Germany) is distinguished by its high temperature resistance, by its high chemical resistance, by a low viscosity in the melt, by a low shrinkage, and by a low thermal expansion.

Figure 21:
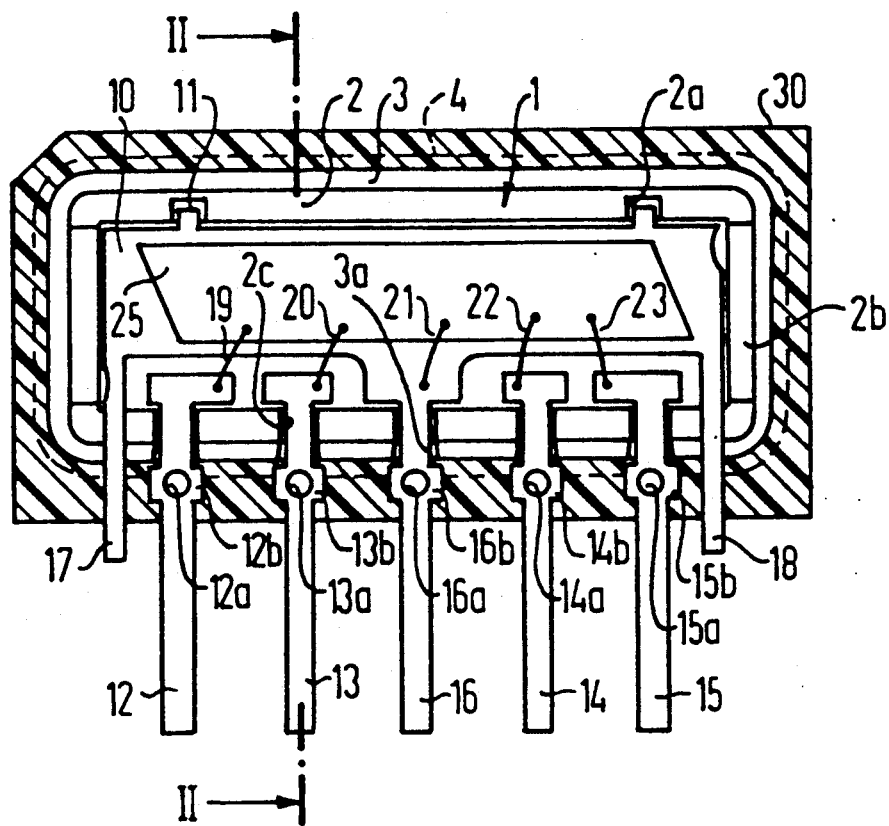
FIG. 21 is a simplified, partially cut and schematic illustration of a plan view onto a surface-wave filter whereby one of the two housing parts of the encapsulation is removed.
Figure 22:
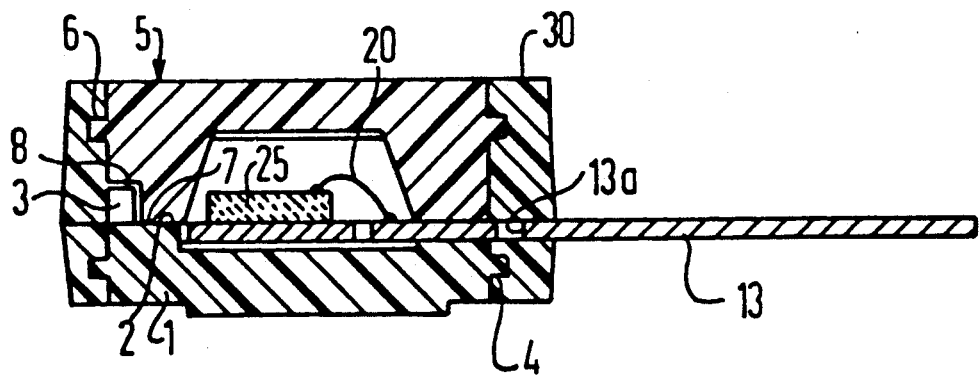
FIG. 22 is a section along the line II—II of FIG. 21 wherein the second housing part is placed onto the first.

The exemplary embodiment of the invention shown in FIGS. 21 and 22 shows a surface-wave filter whose schematically indicated active part 25 is glued to a carrier spider that is formed of a metal carrier 10 and of thermal legs 12-18 for the supply terminals, terminal legs 16-18 thereof being suitable for applying reference potential. The terminal legs 12-16 have their ends situated in the interior of the encapsulation. These ends are contacted via bond wires 19-23 to the corresponding electrodes of the input and output transducers (not shown here), or to the shielding (which is likewise not shown here).

The encapsulation has two shell-shaped and rectangular housing parts 1, 5 each of which respectively has stepped, offset sidewalls 2, 3 or 7, 8, one of which is penetrated in the exit region 2c, 3a of the terminal legs 12-16 and of the terminals 17, 18 (see the housing part). The attitudinally secured arrangement of the carrier spider in the housing part 1 partly occurs by fixing the terminal legs in these penetrations and partly occurs on the basis of projections 11 of the metal carrier layer 10 that engage into corresponding recesses 2a of the sidewall 2.

Though not for exclusive fixing thereof, the sidewall 2 of the housing part 1 has integrally applied projections 2b at its narrow sides that engage into corresponding recesses in the housing part 5 for fixing the two housing parts 1, 5.

The narrow sides of the housing parts 1 and 5 carry peripherally encircling and closed web-shaped sections 4, 6 that have low wall thickness, that are integrally applied to these narrow sides, and that are bonded to an outside encapsulation 30 of thermoplastic plastic. In combination with these sections, the outside encapsulation 30 thus produces a largely hermetic seal of the inside of the encapsulation, particularly the critical region of the joints of the housing and of the exit region of the terminals.

An injection temperature of the outside encapsulation and a melting temperature of sections 4 and 6 are chosen such that the web-shaped sections 4, 6 are partially melted by a plastic compound of the outside encapsulation, particularly due to the small wall thickness of the web-shaped sections, and help form the desired, hermetically tight fused connection with this plastic compound during cooling.

For additional sealing in the exit region 2c, 3a of the terminal legs 12-16 and of the terminals 17, 18, an adhesion promoter, i.e. a hot-melt adhesive, for example polyamide, is applied to the terminal legs in this region and enters into an intimate bond with the outside encapsulation 30.

In order to create a further improved mechanical connection between the outside encapsulation 30 and the terminal legs 12-16, these legs 12-16 can have their surface tapered or expanded in their passage region through the outside encapsulation and, in the latter instance, can be potentially additionally interrupted (see 12a-16a). A "riveting" of the material of the outside encapsulation to the terminal legs is achieved on the basis of this design.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for encapsulating an electronic component or assembly, comprising the steps of:
   providing a component or assembly;
   providing a housing formed of at least two pre-formed thermoplastic plastic housing parts which can be joined together at a joint and with the electronic component or assembly being completely enclosed within the housing, terminal legs extending from within the housing to an outside of the housing, the terminal legs exiting from the housing at an exit region; and
   applying to both parts of the housing in a single injection molding step an outside encapsulation of a thermoplastic plastic by injection molding at least at said joint and at said exit region of the terminal legs.

2. A method for encapsulating an electronic component or assembly, comprising the steps of:
   providing a housing formed of at least two pre-formed thermoplastic plastic housing parts which can be joined together at a joint;
   providing terminal legs mounted to at least one of the housing parts such that when the housing parts are joined together the terminal legs extend from within the housing to an outside of the housing through a peripheral wall thereof;
   placing in one of the housing parts a component or assembly which is electrically connected to inner ends of the terminal legs; and
   assembling the at least two pre-formed housing parts, and thereafter in a single injection molding step, applying to both parts of the housing an outside encapsulation of a thermoplastic by injection molding at least at said joint and where said terminal legs exit from the peripheral walls so as to directly secure the at least two housing parts together.

3. A method for encapsulating an electronic component or assembly, comprising steps of:
   providing a component or assembly;
   manufacturing a pre-formed lower housing part of a thermoplastic plastic by injection molding and providing terminal legs thereat which are at least partially extrusion-coated at a passage region leading to an exit region when injection molding the lower housing part;
   manufacturing a pre-formed upper housing part;
   providing a housing formed of the lower housing part and the upper housing part which are joined together at a joint and with the electronic component or assembly being completely enclosed within the housing, said terminal legs extending from within the housing to an outside of the housing, said terminal legs exiting from the housing at said exit region; and
   applying to both parts of the housing in a single injection molding step an outside encapsulation of a thermoplastic plastic by injection molding at least at said joint and at said exit region of the terminal legs.

4. A method according to claim 3 wherein after the injection molding of the lower housing part, anchoring the component or assembly to a floor of the lower housing part; and connecting inner ends of the terminal legs to respective terminals of the component or assembly in electrically conductive fashion.

5. A method for encapsulating an electronic component or assembly, comprising the steps of:
providing a component or assembly;
manufacturing a pre-formed lower housing part and a pre-formed middle housing part of a thermoplastic plastic by injection molding, and completely extrusion-coating all around terminal legs in a passage region leading to an exit region when injection molding the middle housing part;
manufacturing a pre-formed upper housing part;
providing a housing formed of the lower housing part, middle housing part, and upper housing part which are joined together at respective joints and with the electronic component or assembly being completely enclosed within the housing, said terminal legs extending from within the housing to an outside of the housing, said terminal legs exiting from the housing at said exit region; and
applying to the lower, middle, and upper housing parts of the housing in a single injection molding step an outside encapsulation of a thermoplastic plastic by injection molding at least at said joints and at said exit region of the terminal legs.

6. A method according to claim 5 including the steps of anchoring the component or assembly to a floor of said lower housing part; joining the middle housing part and the lower housing part; and connecting inner ends of the terminal legs in electrically conductive fashion to allocated terminals of the component or assembly.

7. A method for encapsulating an electronic component or assembly, comprising the steps of:
providing a component or assembly;
providing a system carrier formed of an island, an island web, and terminal legs;
securing the component or assembly on the island;
applying by injection molding a pre-formed lower housing part of a thermoplastic plastic to an underside of the system carrier;
connecting inner ends of the terminal legs to respective terminals of the component or assembly in electrically conductive fashion;
providing an upper housing part;
providing a housing formed of the lower and upper housing parts which are joined together at a joint and with the electronic component or assembly being completely enclosed within the housing, said terminal legs extending from within the housing to an outside of the housing, the terminal legs exiting from the housing at an exit region; and
applying to the upper and lower housing parts of the housing in a single injection molding step an outside encapsulation of a thermoplastic plastic by injection molding at least at said joint and at said exit region of the terminal legs.

8. A method according to claim 7 including the step of applying an adhesion promoter on the system carrier in a passage region of the terminal legs leading to the exit region.

9. A method according to claim 7 including the step of partially filling interspaces between the terminal legs with thermoplastic plastic when applying the lower housing part to the system carrier.

10. A method according to claim 7 including the step of anchoring the island web in the thermoplastic plastic when applying the lower housing part to the system carrier.

11. A method for encapsulating an electronic component or assembly, comprising the steps of:
providing a component or assembly;
providing a housing formed of at least two pre-formed housing parts which can be joined together at a joint and with the electronic component or assembly being completely enclosed within the housing, terminal legs extending from within the housing to an outside of the housing, the terminal legs exiting from the housing at an exit region, and peripherally encircling outwardly protruding sections being provided on each of the two housing parts; and
applying to both parts of the housing in a single injection molding step an outside encapsulation of a thermoplastic plastic by injection molding at least at said joint and at said exit region of the terminal legs, and bonding the encircling sections to the outside encapsulation by choosing an injection temperature of the encapsulation and a meeting temperature of the encircling sections such that the encircling sections are partially melted by the plastic compound, said encircling sections providing a fused connection with the outside encapsulation during cooling.

* * * * *